(12) United States Patent
Kushida

(10) Patent No.: US 6,940,746 B2
(45) Date of Patent: Sep. 6, 2005

(54) SEMICONDUCTOR MEMORY DEVICE

(75) Inventor: Keiichi Kushida, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/809,337

(22) Filed: Mar. 26, 2004

(65) Prior Publication Data
US 2004/0179406 A1 Sep. 16, 2004

Related U.S. Application Data

(62) Division of application No. 10/419,174, filed on Apr. 21, 2003, now Pat. No. 6,781,870.

(30) Foreign Application Priority Data

Feb. 25, 2003 (JP) .................................... 2003-047732

(51) Int. Cl.[7] .................................................. G11C 7/00
(52) U.S. Cl. ........................................ 365/154; 365/156
(58) Field of Search ................................ 365/154, 156, 365/230.06

(56) References Cited

U.S. PATENT DOCUMENTS

| 4,189,785 A | * | 2/1980 | Rapp | .......................... 365/156 |
|---|---|---|---|---|
| 5,375,086 A | | 12/1994 | Wahlstrom | |
| 5,831,896 A | * | 11/1998 | Lattimore et al. | .......... 365/154 |
| 2003/0147271 A1 | | 8/2003 | Jo | |

OTHER PUBLICATIONS

Hiep Tran, "Demonstration of 5T SRAM and 6T Dual–Port RAM Cell Arrays", 1996 Symposium on VLSI Circuits Digest of Technical Papers, 1996, pp. 68–69.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes first and second CMOS (complementary metal oxide semiconductor) inverter circuits each having a latch structure and a control transistor which is connected between a storage node of the first CMOS inverter circuit and a bit line and whose gate is connected to a word line. The device further includes a selection circuit to apply one of a first voltage and a second voltage different from the first voltage to a power supply node of at least the second CMOS inverter circuit. The selection circuit applies the second voltage to the power supply node of the second CMOS inverter circuit at least in "1" data write mode.

4 Claims, 9 Drawing Sheets

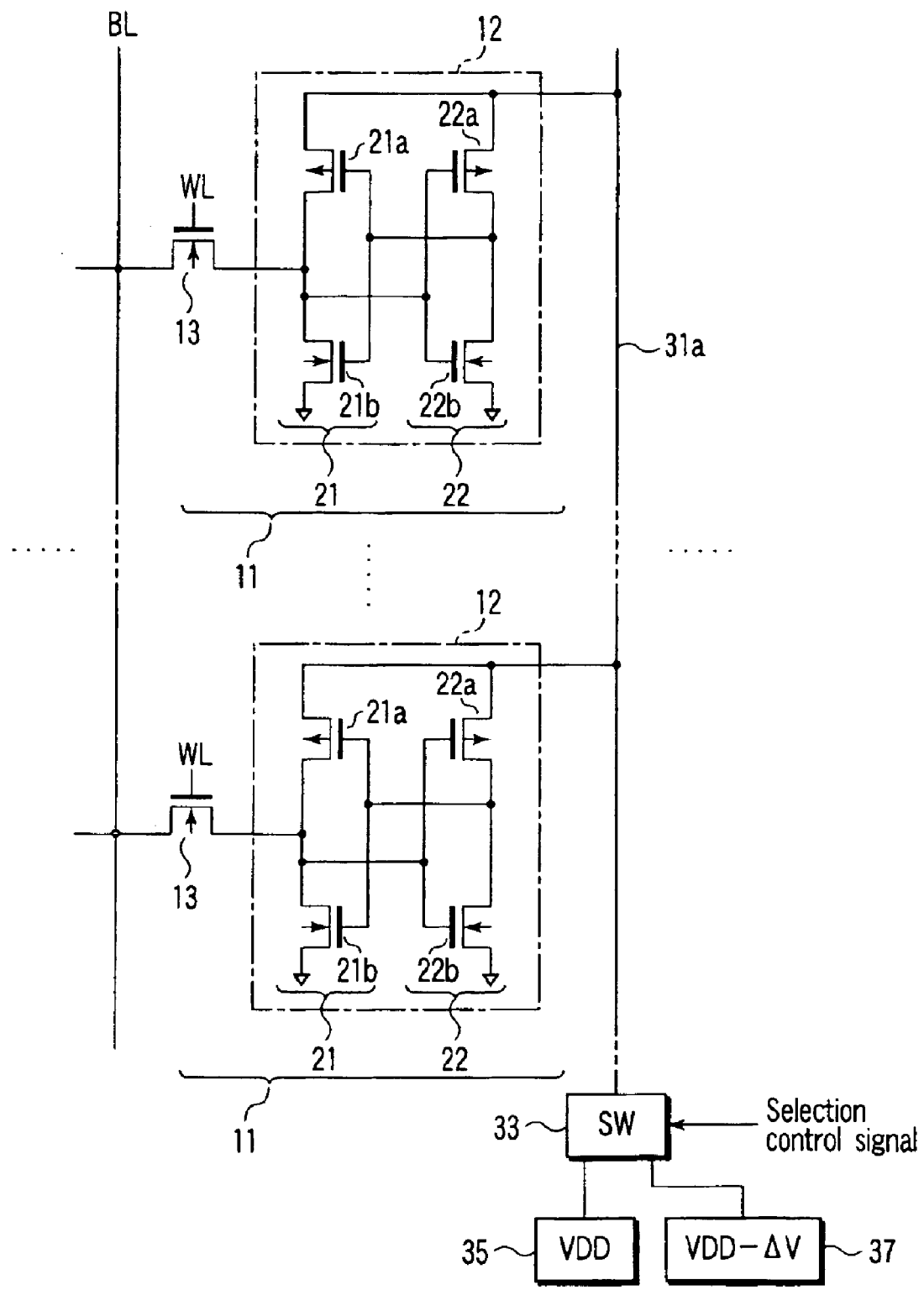
F I G. 3

FIG. 6A Load voltage 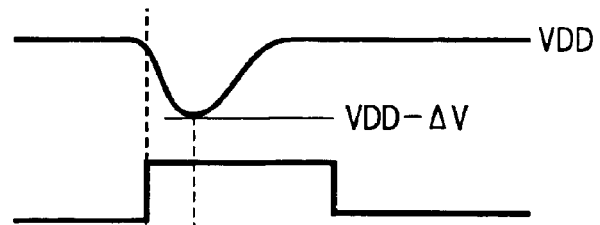
FIG. 6B WL 
FIG. 6C WRITE 
FIG. 6D $O_{21}$ 

US 6,940,746 B2

SEMICONDUCTOR MEMORY DEVICE

CROSS-REFERENCE TO RELATED APPLICATIONS

This application is a division of and claims the benefit of priority under 35 USC §120 from U.S. Ser. No. 10/419,174, filed Apr. 21, 2003, now U.S. Pat. No. 6,781,870, and is based upon and claims the benefit of priority under 35 USC §119 from Japanese Patent Applications No. 2003-047732, filed Feb. 25, 2003, the entire contents of which are incorporated herein by reference.

BACKGROUND OF THE INVENTION

1. Field of the Invention

The present invention relates to a semiconductor memory device. More specifically, the invention relates to a semiconductor memory device having a 5-transistor SRAM (static random access memory) cell structure.

2. Description of the Related Art

Recently, in 6-transistor SRAM cells, it has been more difficult to ensure stability as variations in threshold value increase due to microfabrication of transistors. In contrast, 5-transistor SRAM cells are so configured that the sizes and threshold values of transistors making up the cells become asymmetrical and thus have an advantage that its stability is secured more easily than the 6-transistor SRAM cells without increasing the cell size or reducing the cell current. A 6-transistor SRAM cell tends to be configured so as to read data through a single port; therefore, a difference in access speed between the prior art 5-transistor SRAM cell (having a dual port) and the 6-transistor SRAM cell becomes smaller, though the 5-transistor SRAM cell had a great disadvantage in access speed. In the prior art 5-transistor SRAM cells, however, it is difficult to write data "1" while keeping data of non-selected cells, and thus the cells are difficult to achieve as an array.

The structure of a prior art 5-transistor SRAM cell will now be described in brief. As shown in FIG. 10, the prior art 5-transistor SRAM cell includes a pair of CMOS (complementary metal oxide semiconductor) inverter circuits 101 and 102 each having a latch structure for data storage and an input/output control transistor (gate transistor) 103 which is connected between the output terminal of the CMOS inverter circuit 101 and a bit line BL and whose gate is connected to a word line WL. The 5-transistor SRAM cell can reduce the number of transistors and that of bit lines by one and thus its area reduction effect is greater than that of the 6-transistor SRAM cell.

The prior art 5-transistor SRAM cell has only one bit line BL. Therefore, the same bit line BL has to be used to write both data "0" and "1."

An operation of writing data "1" in the prior art 5-transistor SRAM cell will now be described. In "1" data write mode, the bit line BL is set at a high (Hi) level to turn on a gate transistor 103 as shown in FIG. 11. If, in this time, the output (Lo→Hi) of the CMOS inverter circuit 101 becomes higher than the threshold value of input of the CMOS inverter circuit 102, the output of the CMOS inverter circuit 102 is inverted (Hi→Lo). Accordingly, the input of the CMOS inverter circuit 101 is inverted and thus writing of data "1" is completed.

The output of the CMOS inverter 101 in "1" data write mode depends upon the ratio of on-resistance of the gate transistor 103 to that of a driver transistor (N-type MOS transistor) 101a. It is thus necessary to set the above on-resistance such that the output of the CMOS inverter circuit 101 becomes considerably greater than the threshold value of the input of the CMOS inverter circuit 102. In most cases, however, the on-resistance of the driver transistor 101a has to be set lower in order to ensure the cell current and stabilize the cell. For this reason, conventionally, it was difficult to set the above on-resistance such that the output of the CMOS inverter circuit 101 became very high in "1" data write mode.

BRIEF SUMMARY OF THE INVENTION

According to an aspect of the present invention, there is provided a semiconductor memory device comprising first and second CMOS (complementary metal oxide semiconductor) inverter circuits each having a latch structure, a control transistor which is connected between a storage node of the first CMOS inverter circuit and a bit line and whose gate is connected to a word line, and a selection circuit to apply one of a first voltage and a second voltage different from the first voltage to a power supply node of at least the second CMOS inverter circuit, wherein the selection circuit applies the second voltage to the power supply node of the second CMOS inverter circuit at least in "1" data write mode.

BRIEF DESCRIPTION OF THE SEVERAL VIEWS OF THE DRAWING

FIG. 3 is a circuit arrangement of an array section of an SRAM according to a second embodiment of the present invention;

FIGS. 6A to 6D are timing charts showing an operation of writing data "1" by use of the selector circuit shown in FIG. 5;

DETAILED DESCRIPTION OF THE INVENTION

Figure 1:
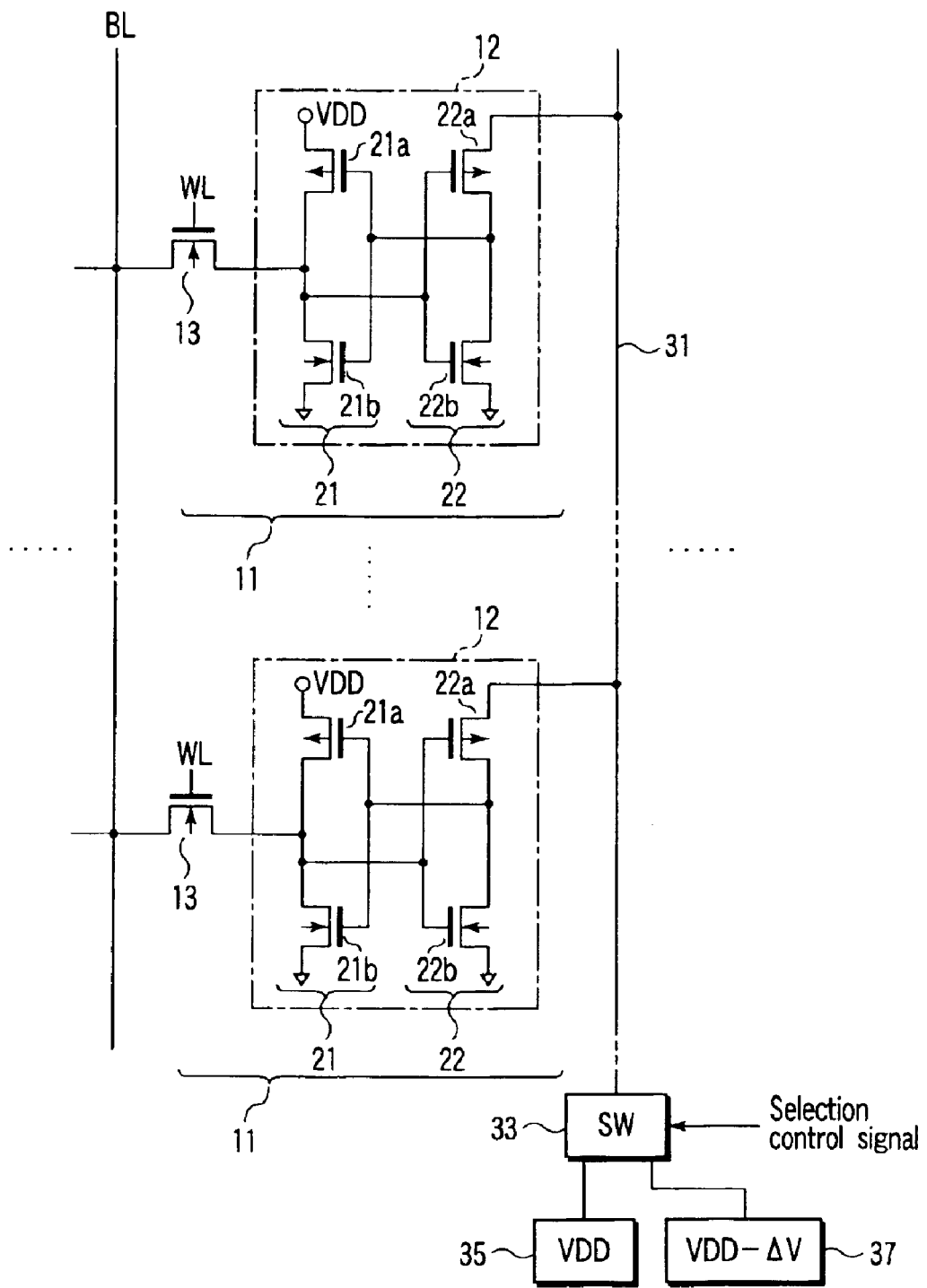
FIG. 1 is a circuit arrangement of an array section of an SRAM according to a first embodiment of the present invention.

Embodiments of the present invention will now be described with reference to the accompanying drawings.
First Embodiment FIG. 1 shows a circuit arrangement of an array section of a semiconductor memory device (SRAM) according to a first embodiment of the present invention. The array section has a memory structure as shown in FIG. 1. In other words, a plurality of 5-transistor SRAM cells 11 are connected in parallel to a plurality of bit lines BL and a plurality of word lines WL. Each of the cells 11 includes a latch structure section 12 for data storage and a control transistor (N-type MOS transistor) 13.

The latch structure section 12 includes a pair of CMOS inverter circuits (first CMOS inverter circuit 21 and second CMOS inverter circuit 22). The first CMOS inverter circuit 21 is formed by connecting the gate terminals of a P-type MOS transistor (load transistor) 21a and an N-type MOS transistor (driver transistor) 21b and connecting the drain terminals thereof. A voltage VDD is applied to the source terminal of the P-type MOS transistor 21a. A voltage VSS is applied to the source terminal of the N-type MOS transistor 21b. The second CMOS inverter circuit 22 is formed by connecting the gate terminals of a P-type MOS transistor (load transistor) 22a and an N-type MOS transistor (driver transistor) 22b and connecting the drain terminals thereof. A source terminal of the P-type MOS transistor 22a, which serves as a power supply node, is connected to a VDD power line (power control node) 31. A voltage VSS is applied to the source terminal of the N-type MOS transistor 22b. The output terminal of the first CMOS inverter circuit 21 (common drain of the P-type MOS transistor 21a and N-type MOS transistor 21b) is connected to the input terminal of the second CMOS inverter circuit 22 (the common gate of the P-type MOS transistor 22a and N-type MOS transistor 22b). The output terminal of the second CMOS inverter circuit (the common drain of the P-type MOS transistor 22a and N-type MOS transistor 22b) is connected to the input terminal of the first CMOS inverter circuit 21 (the common gate of the P-type MOS transistor 21a and N-type MOS transistor 21b).

The drain terminal of the control transistor 13 is connected to the bit line BL and the source terminal thereof is connected to the storage node (output terminal) of the first CMOS inverter circuit 21 in the latch structure section 12. The gate terminals of control transistors 13 of a given number of 5-transistor SRAM cells 11 connected to their common bit line BL are connected to different word lines WL.

A plurality of VDD power lines 31 are provided and each of the power lines 31 is common to a plurality of 5-transistor SRAM cells 11 arranged in the direction of the bit line BL. In other words, each of the VDD power lines 31 is connected to the source terminals of P-type MOS transistors 22a of at least the second CMOS inverter circuits 22 of a given number of 5-transistor SRAM cells 11 connected to their common bit line BL. A first power supply 35 and a second power supply 37 are connected to each of the VDD power lines 31 via a power supply selection switch (selection circuit) 33. The first power supply 35 generates a first voltage VDD and the second power supply 37 generates a second voltage VDD−ΔV. ΔV is set at about 5% to 30% of the first voltage VDD. In other words, the second voltage VDD−ΔV is set at about 95% to 70% of the first voltage VDD.

The power supply selection switch 33 is controlled in response to a selection control signal (e.g., a word line selection signal that has not yet been decoded) corresponding to the rise time of the word line WL. In other words, the switch 33 is used to apply the second voltage VDD−ΔV to the VDD power supply line 31 at least in "1" data write mode.

The SRAM having a memory structure as described above has a standby mode, a data read mode, a "0" data write mode and "1" data write mode. A load voltage (power supply voltage of the second CMOS inverter circuit 22) is controlled in different manners in the "1" data write mode and the other modes. More specifically, in the standby, data read, and "0" data write modes, the first voltage VDD is applied to the source terminal of the P-type MOS transistor 22a from the first power supply 35 as in the prior art. In the "1" data write mode, the power supply selection switch 33 is controlled to apply the second voltage VDD−ΔV, which is lower than the first voltage VDD by ΔV, to the source terminal of the P-type MOS transistor 22a from the second power supply 37. Thus, the power supply voltage applied to the second CMOS inverter circuit 22 lowers and accordingly the threshold value of the input of the second CMOS inverter circuit 22 decreases. The output of the second CMOS inverter circuit 22, which has not yet been inverted, is decreased by voltage ΔV. In the first CMOS inverter circuit 21, the on-resistance of the N-type MOS transistor 21b increases and so does the output thereof. Consequently, the 5-transistor SRAM cells 11 are likely to cause an inversion operation for writing data "1."

As described above, the threshold value of input of the second CMOS inverter circuit 22 is temporarily decreased in "1" data write mode in the 5-transistor SRAM cell (selected cell) 11. Thus, data "1" can stably be written to the selected cell. The conventional problem of "1" data writing in the 5-transistor SRAM cell can thus be avoided. In particular, if a sufficient voltage ΔV (e.g., about 30% of the first voltage VDD) is secured, substantially the same write speed as that of a generally-used 6-transistor SRAM cell can be maintained.

The following are descriptions of degradation of a signal noise margin (referred to as an SNM hereinafter) in the other 5-transistor SRAM cells (non-selected cells) arranged in the direction of the bit line BL, which is likely to cause a problem in "1" data write mode. The SNM corresponds to the length of one side of the largest square within an area surrounded with the static (transfer) characteristics (of the two cell inverters) in "1" data write mode and data read mode. One cell has two areas surrounded with the static (transfer) characteristics (of the two cell inverters), and a smaller one of two SNMs defined by the respective areas is referred to as an SNM of a cell.

Figure 2:
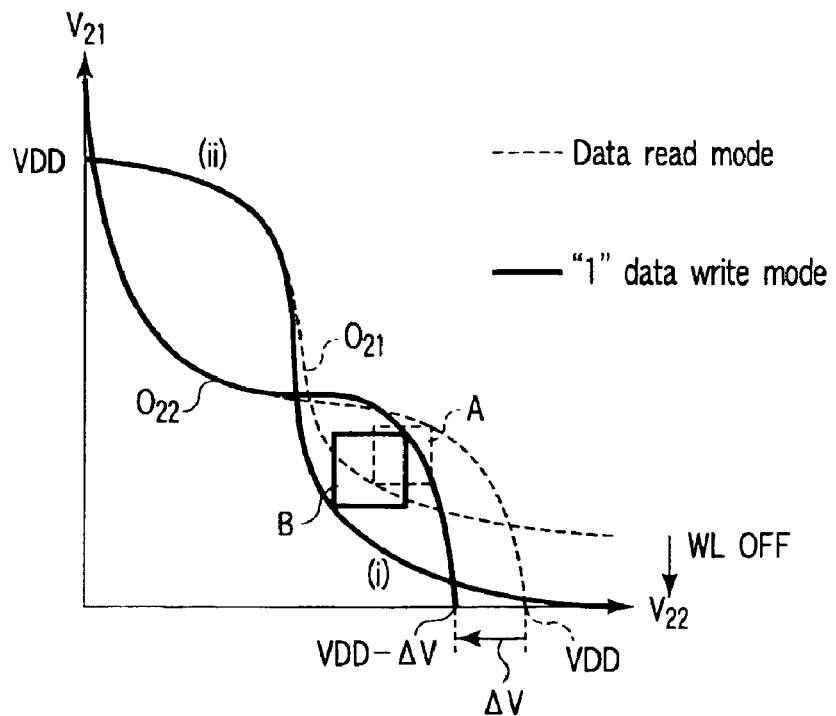
FIG. 2 is a graph of static transfer characteristics of 5-transistor SRAM cells (non-selected cells) that make up the array section shown in FIG. 1.

FIG. 2 shows static transfer characteristics of a non-selected cell of the 5-transistor SRAM cells according to the first embodiment of the present invention. In FIG. 2, the solid lines indicate the static (transfer) characteristics (of the two cell inverters) in "1" data write mode and the broken lines indicate the static (transfer) characteristics (of the two cell inverters) in data read mode. Further, $V_{21}$ shows a power supply voltage of the first CMOS inverter circuit 21, $V_{22}$ shows a power supply voltage of the second CMOS inverter circuit 22, $O_{21}$ denotes an output of the first CMOS inverter circuit 21, and $O_{22}$ represents an output of the second CMOS inverter circuit 22. In "1" data write mode, the same voltage drop (−ΔV) occurs in the non-selected 5-transistor SRAM cells 11 connected to their common VDD power line 31. However, the degradation of SNM in "1" data write mode does not particularly cause any problem. The reason is as follows. In area (i), the SNM of a non-selected cell in normal data read mode (word line WL: ON) is of the size indicated by a broken line A. On the other hand, the SNM of the non-selected cell in "1" data write mode is of the size indicated by a solid line B. The reduction (degradation) of SNM due to the voltage drop in the non-selected cell can be compensated with the improvement in latch characteristics of the first CMOS inverter circuit 21. In short, the respective 5-transistor SRAM cells 11 connected in the direction of the bit line BL can be designed to prevent the total SNM from being degraded.

In the other 5-transistor SRAM cells (non-selected cells) 11, the first voltage VDD is applied to the source terminal of each p-type MOS transistor 22a in "1" data write mode. No error data "1" is forcibly written.

An operation of applying the second voltage VDD–ΔV to the source terminal of each P-type MOS transistor 22a is limited to the cells in a column including a 5-transistor SRAM cell 11 that writes data "1." Therefore, the number of cells per column can be reduced to minimize the increase in power consumption due to charge and discharge at the source terminal.

Furthermore, a voltage drop at the source terminal of the P-type MOS transistor 22a in "1" data write mode is less than that in the case where the voltage applied to the bit line BL is swung in full. The voltage drop therefore hardly affects the access speed.

Particularly in the first CMOS inverter circuit 21, the voltage drop does not degrade the SNM. It is thus possible to stabilize the SNM more greatly.

According to the first embodiment described above, a 5-transistor SRAM cell (array) capable of writing data "1" with stability can be achieved without losing cell area reduction effect, decreasing write speed, compromising stability, or the like.

Second Embodiment

FIG. 3 shows a circuit arrangement of an array section of a semiconductor memory device (SRAM) according to a second embodiment of the present invention. The same components as those of the first embodiment are denoted by the same reference numerals and their detailed descriptions are omitted.

In the second embodiment, a load voltage (second voltage VDD–ΔV), which is lower than the above first voltage VDD by ΔV, is applied to the source terminal (power supply node) of each of P-type MOS transistors 21a and 22a through a VDD power supply line 31a under the control of a power supply selection switch (selection circuit) 33 in "1" data write mode. In other words, the VDD power supply line 31a is connected to the source terminals of P-type MOS transistors 21a and 22a of first and second CMOS inverter circuits 21 and 22 of each of a given number of 5-transistor SRAM cells 11 arranged in the direction of a bit line BL.

Figure 4:
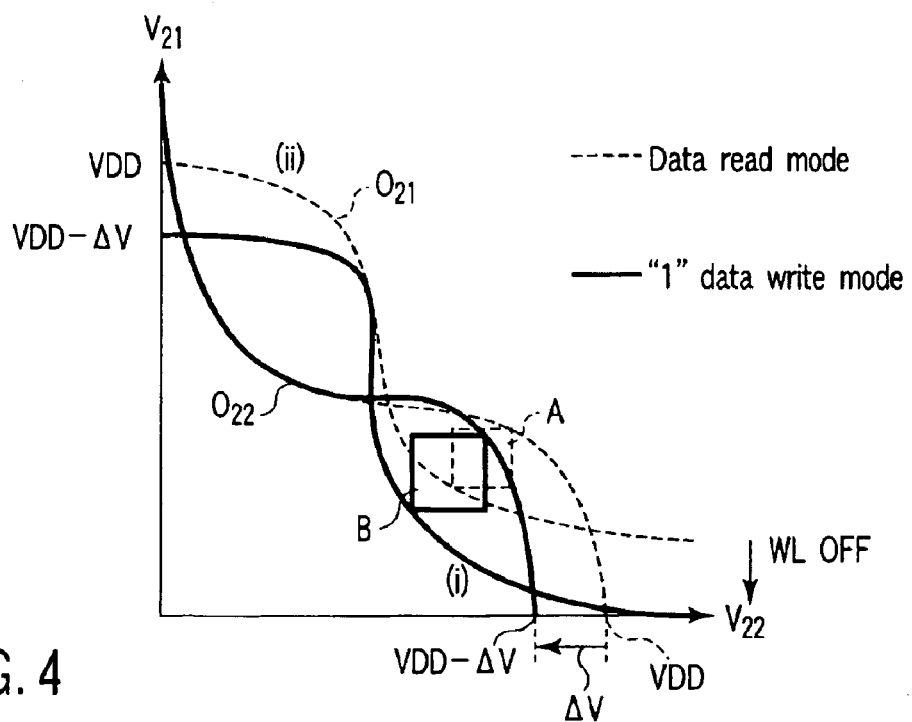
FIG. 4 is a graph of static transfer characteristics of 5-transistor SRAM cells (non-selected cells) that make up the array section shown in FIG. 3.

With the above arrangement, a drop in the power supply voltage applied to the first CMOS inverter circuit 21 degrades the SNM in the area (ii) shown in FIG. 4. The SNM in the area (ii) is originally greater than that in the area (i). The device is therefore easy to design such that the SNM in the area (ii) exceeds that in the area (i). As compared with the first embodiment, the parasitic capacitance of the VDD power supply line 31a increases slightly, but it hardly affects the access speed.

Substantially the same advantage as that of the first embodiment can be expected even in the circuit arrangement of the second embodiment. In other words, a 5-transistor SRAM cell (array) capable of writing data "1" with stability can be achieved without losing cell area reduction effect, decreasing write speed, compromising stability, or the like.

In the first and second embodiments described above, the second voltage VDD–ΔV is selected as a load voltage in "1" data write mode under the control of the power supply selection switch 33 serving as a selection circuit. However, the selection circuit is not limited to the switch 33. The following is another arrangement of the selection circuit.

Figure 5:
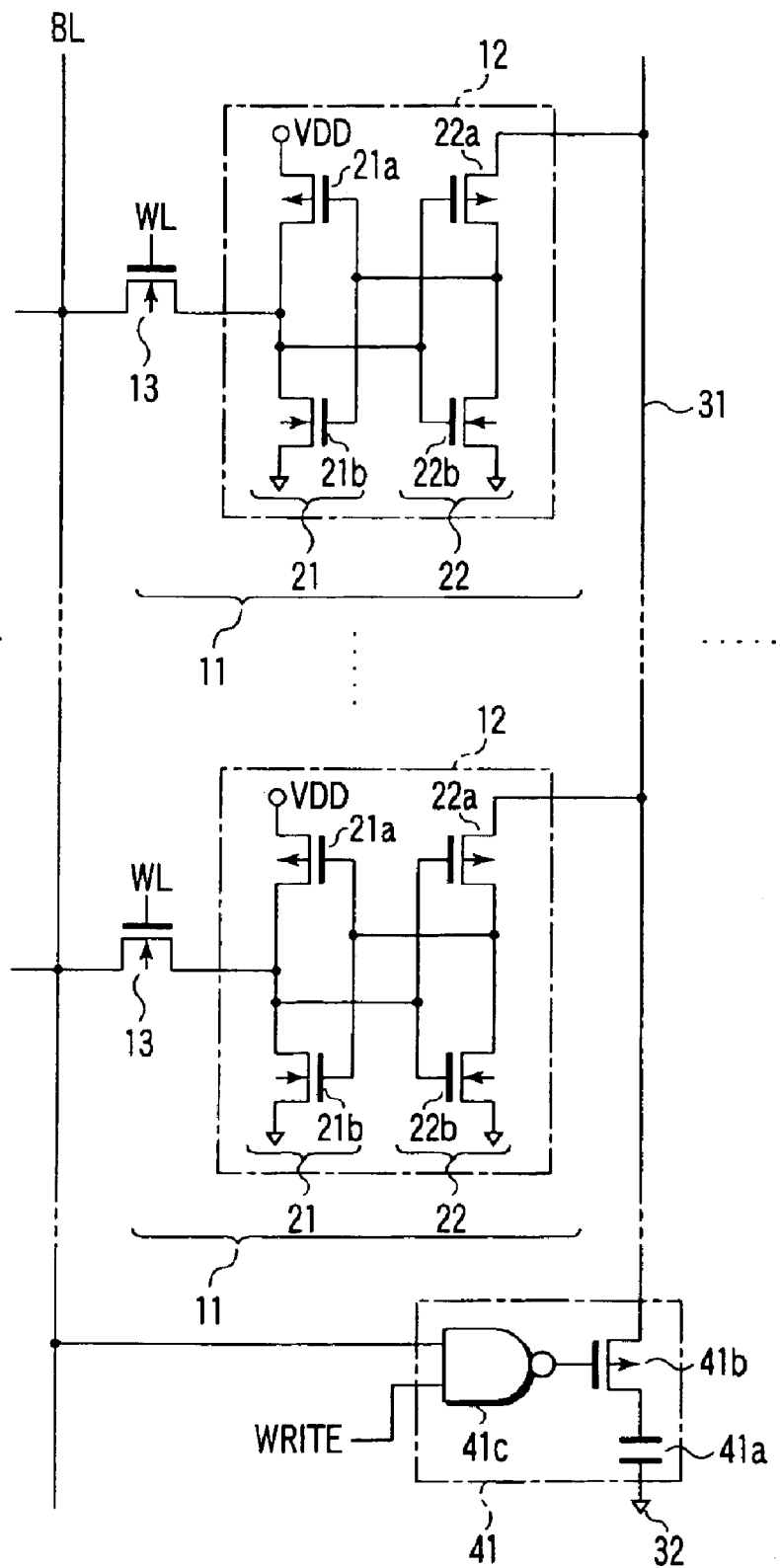
FIG. 5 is a circuit arrangement of a selector circuit.

FIG. 5 shows another example of the selection circuit. The example is applied to the first embodiment. In this example, a selection circuit 41 includes a capacitor 41a, a switching transistor (P-type MOS transistor) 41b and a NAND circuit (logic circuit) 41c. The capacitor 41a has a capacity corresponding to the voltage drop (–ΔV) described above and is interposed between a VDD power supply line 31 and a VSS terminal 32. The switching transistor 41b is connected in series to the capacitor 41a. The NAND circuit 41c performs a NAND operation for an output WRITE of an AND circuit (not shown), which performs an AND operation for a word line selection signal and a write enable signal, and a bit line selection signal. The switching transistor 41b is turned on and off by the output of the NAND circuit 41c.

In the above example, the switching transistor 41b turns on when the output WRITE becomes high in level as shown in FIGS. 6A to 6D. Then, the capacitor 41a sets the potential of the VDD power supply line 31 at VDD–ΔV for a given period of time. Data "1" is therefore written to the 5-transistor SRAM cells (selection cells) 11 with stability.

Figure 7:
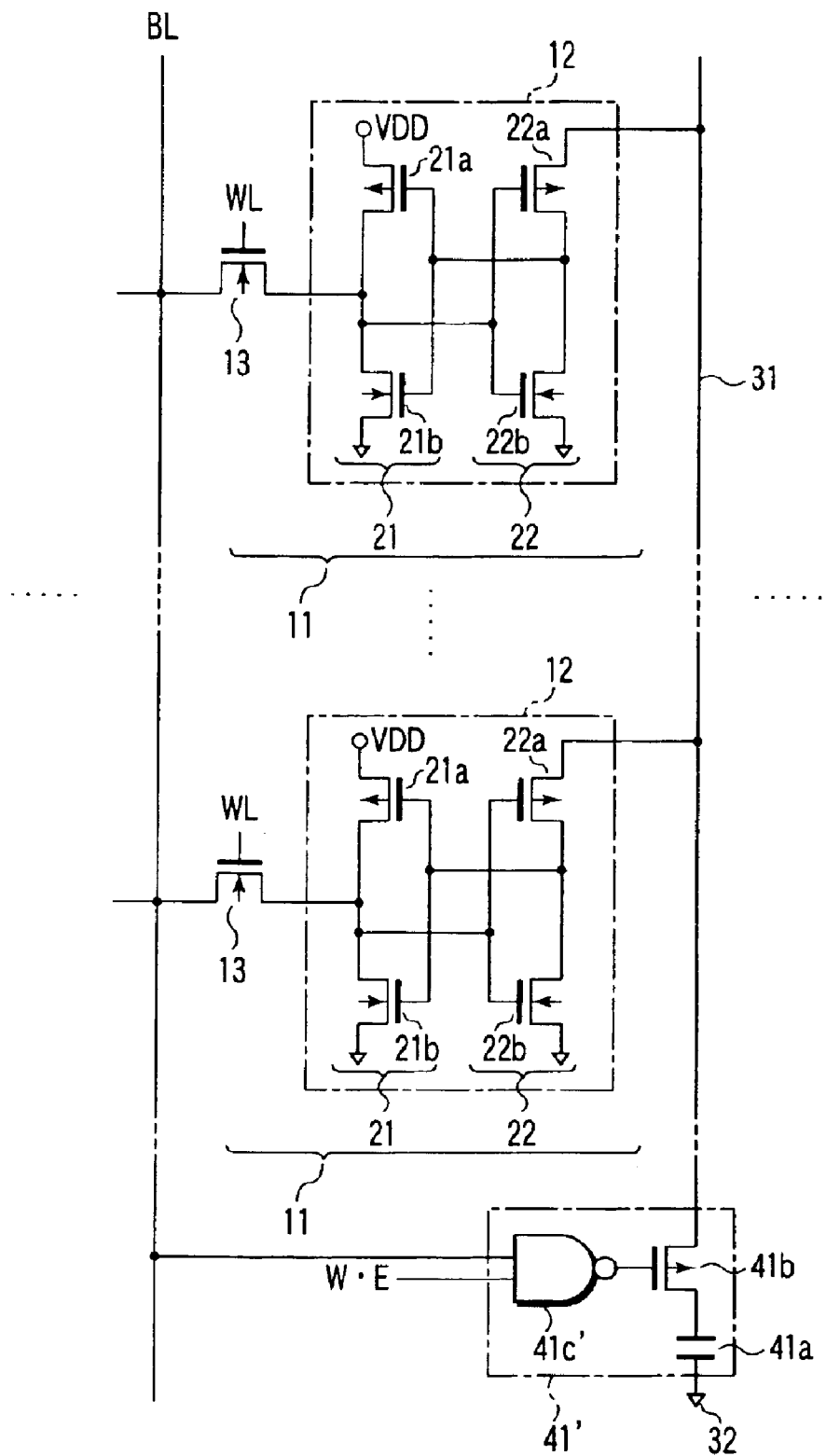
FIG. 7 is another circuit arrangement of the selector circuit.

FIG. 7 shows still another example of the selection circuit. This example is applied to the first embodiment and directed to a selection circuit 41' that is so arranged that the gate of the switching transistor 41b is controlled by the output of a NAND circuit 41c' that performs a NAND operation for a write enable signal (W·E) for selecting a word line and a bit line selection signal.

In the selection circuit 41' so arranged, the switching transistor 41b turns on when the output of the NAND circuit 41c' becomes low in level by selecting a bit line BL. In this case, the switching transistor 41b turns on regardless of "1" data write mode or "0" data write mode. The potential of the VDD power supply line 31 is therefore set at VDD–ΔV for a given period of time. Consequently, data "1" is written to the 5-transistor SRAM cells (selection cells) 11 with stability, as in the selection circuit 41 described above. Moreover, data "0" is normally written though the potential of the VDD power supply line 31 is set at VDD–ΔV in "0" data write mode.

In the second embodiment, too, the selection circuits 41 and 41' as shown in FIGS. 5 and 7 can be adopted.

Third Embodiment

Figure 8:
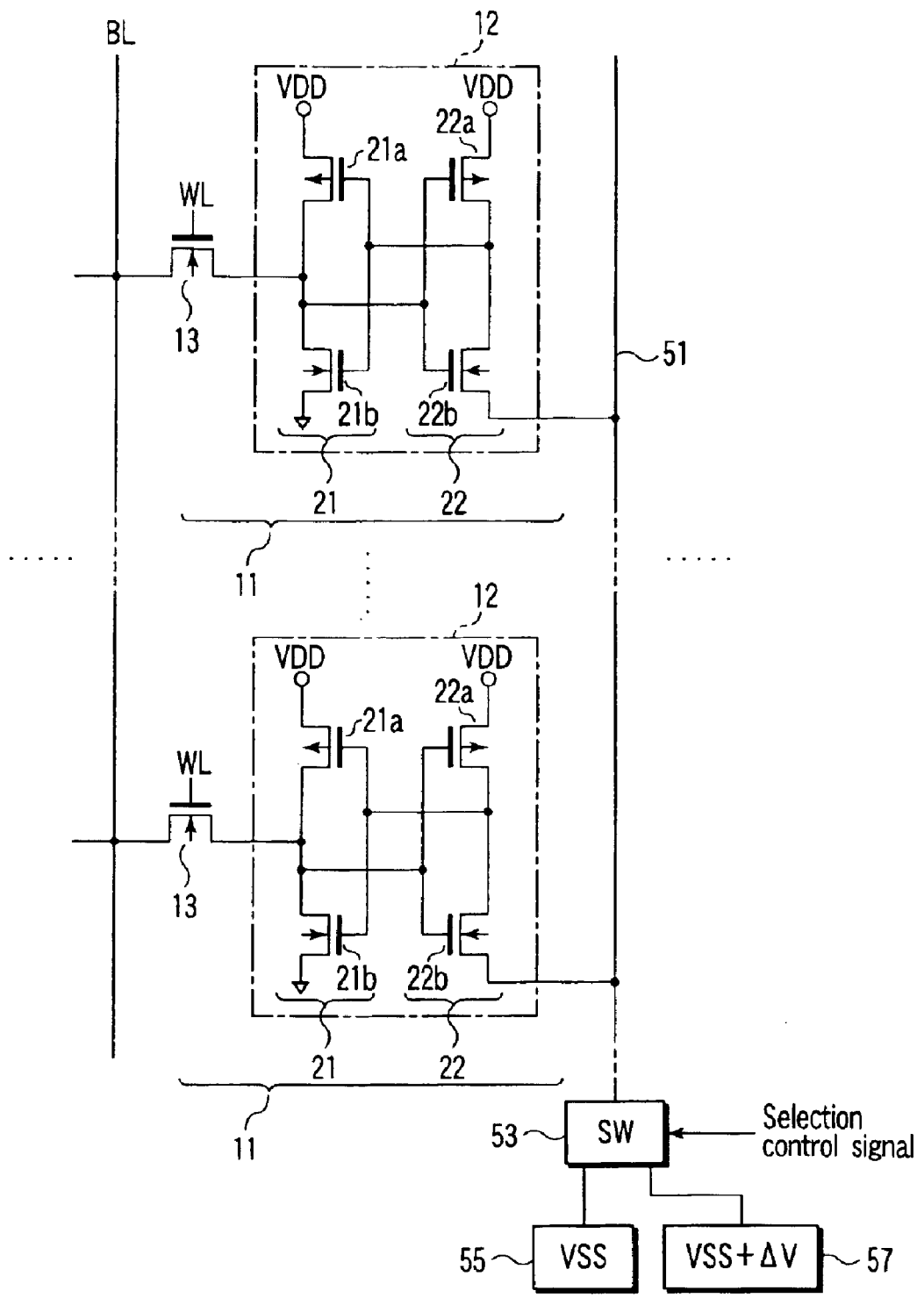
FIG. 8 is a circuit arrangement of an array section of an SRAM according to a third embodiment of the present invention.

FIG. 8 shows a circuit arrangement of an array section of a semiconductor memory device (SRAM) according to a third embodiment of the present invention. In the third embodiment, the source voltage (driver voltage) of a driver transistor 22b is controlled in "1" data write mode. The same components as those of the first embodiment are denoted by the same reference numerals and their detailed descriptions are omitted.

In the third embodiment, a VSS power line 51 is connected to the source terminal (power supply) of an N-type MOS transistor 22 of each of a given number of 5-transistor SRAM cells 11 arranged in the direction of a bit line BL. A driver voltage that is ΔV lower than the first voltage VSS from a first power supply 55, namely, a second voltage VSS–ΔV from a second power supply 57 is applied to the source terminal of the N-type MOS transistor 22b through the VSS power line 51 under the control of a power supply selection switch (selection circuit) 53 in "1" data write mode. In this case, the second voltage VSS–ΔV is set at about 95% to 70% of the first voltage VSS (the above voltage ΔV is set at about 5% to 30% of the first voltage VSS).

In the circuit arrangement of the third embodiment, too, substantially the same advantage as that of the first embodiment can be expected. In other words, a 5-transistor SRAM cell (array) capable of writing data "1" with stability can be achieved without losing cell area reduction effect, decreasing write speed, compromising stability, or the like.

Fourth Embodiment

Figure 9:
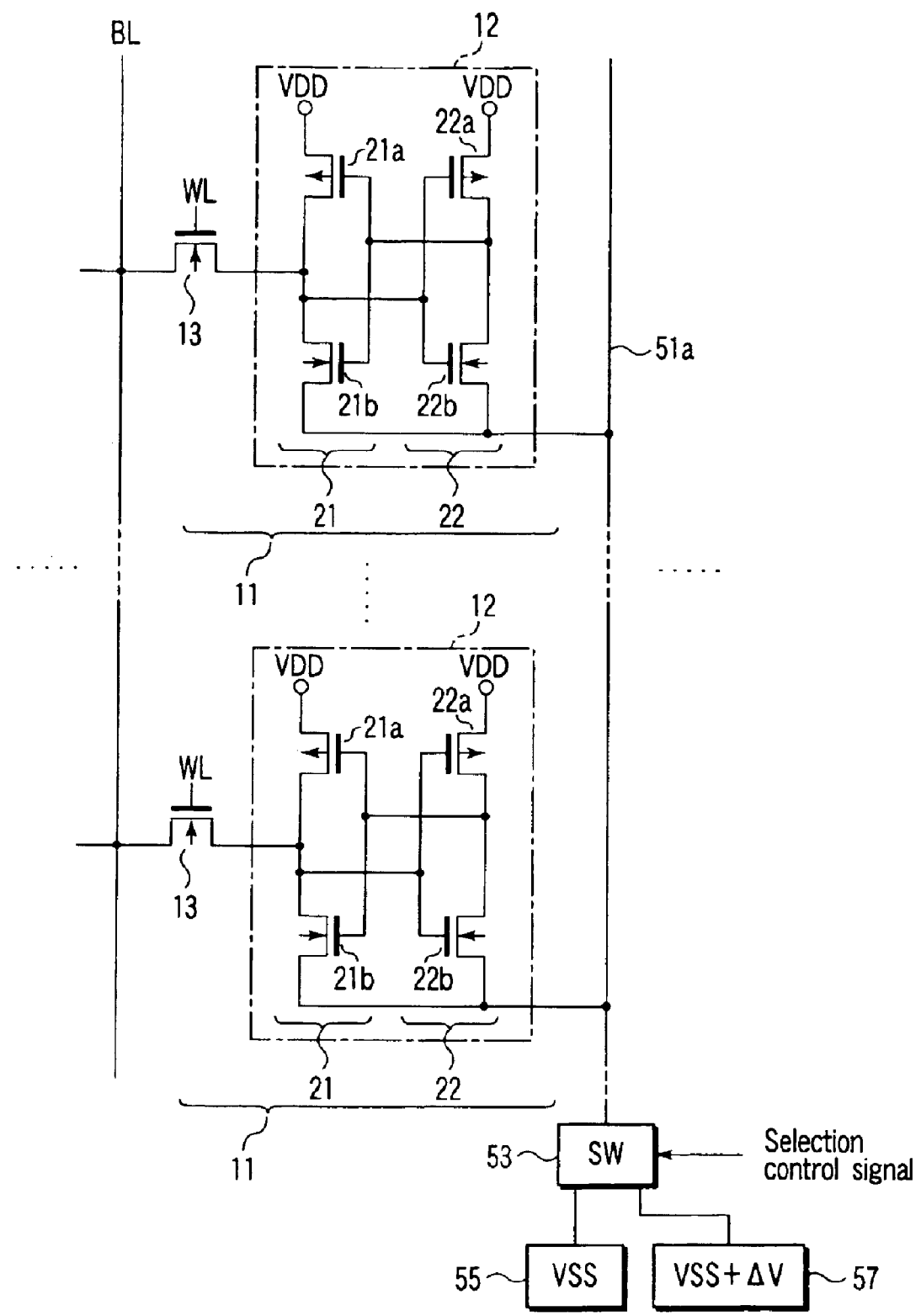
FIG. 9 is a circuit arrangement of an array section of an SRAM according to a fourth embodiment of the present invention.
Figure 10:
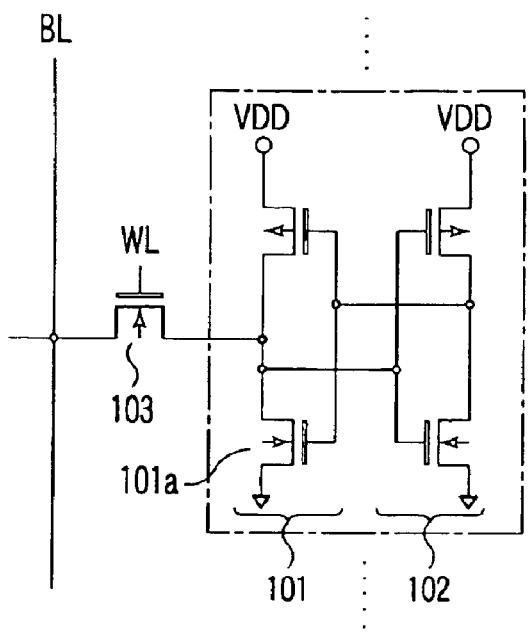
FIG. 10 is a circuit arrangement of prior art 5-transistor SRAM cells to describe its problems.
Figure 11:
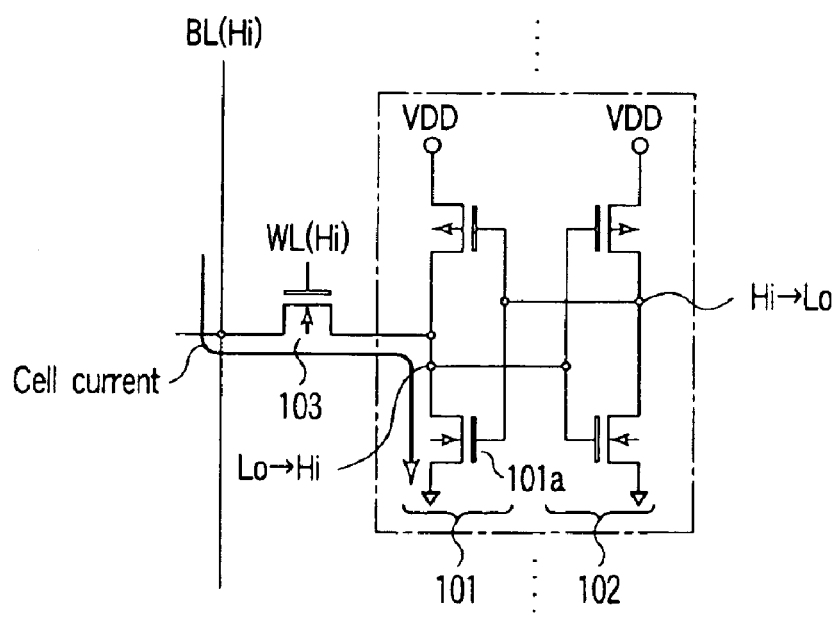
FIG. 11 is a circuit arrangement of the prior art 5-transistor SRAM cells to describe an operation of writing data "1."

FIG. 9 shows a circuit arrangement of an array section of a semiconductor memory device (SRAM) according to a fourth embodiment of the present invention. In the fourth embodiment, the source voltage (driver voltage) of each of driver transistors 21b and 22b is controlled in "1" data write mode. The same components as those of the second embodiment are denoted by the same reference numerals and their detailed descriptions are omitted.

In the fourth embodiment, a driver voltage (second voltage VSS+ΔV), which is higher than the first voltage VSS by ΔV, is applied to the source terminal (power supply node) of each of N-type MOS transistors 21b and 22b through a VSS power line 51a under the control of a power supply selection switch (selection circuit) 53 in "1" data write mode. In other words, the VSS power supply line 51a is connected to the source terminals of N-type MOS transistors 21b and 22b of first and second CMOS inverter circuits 21 and 22 of a given period of 5-transistor SRAM cells 11 arranged in the direction of a bit line BL.

In the circuit arrangement of the fourth embodiment, too, substantially the same advantage as that of the second embodiment can be expected. In other words, a 5-transistor SRAM cell (array) capable of writing data "1" with stability can be achieved without losing cell area reduction effect, decreasing write speed, compromising stability, or the like.

In the third and fourth embodiments, too, the selection circuits as shown in FIGS. 5 and 7 can be adopted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a memory structure in which a plurality of 5-transistor cells each including first and second CMOS (complementary metal oxide semiconductor) inverter circuits having a latch structure and a control transistor which is connected between a storage node of the first CMOS inverter circuit and a bit line and whose gate is connected to a word line are connected to a plurality of bit lines and a plurality of word lines, the semiconductor memory device comprising:

at least one power line connected to a source terminal of an N-type MOS transistor of at least the second CMOS inverter circuit of each of the 5-transistor cells connected to the bit lines; and at least one selection circuit which applies second voltage, which is different from a first voltage, to the source terminal of the N-type MOS transistor of the second CMOS inverter circuit of the 5-transistor cells through said at least one power line in a "1" data write mode, or applies the first voltage to the source terminal of the N-type MOS transistor of the second CMOS inverter circuit of the 5-transistor cells through said at least one power line in another mode.

2. The semiconductor memory device according to claim 1, wherein said at least one power line is connected to a source terminal of an N-type MOS transistor of the first CMOS inverter circuit of each of the 5-transistor cells connected to the bit lines, and said at least one selection circuit applies the second voltage to the source terminal of N-type MOS transistor of the first and second CMOS inverter circuits of the 5-transistor cells through said at least one power line in the "1" data write mode.

3. The semiconductor memory device according to claim 1, wherein the second voltage is different from the first voltage by a predetermined voltage.

4. The semiconductor memory device according to claim 1, wherein the differences between the second voltage and the first voltage is 5% to 30% of the first voltage.

* * * * *